US012637767B2

(12) United States Patent
Martinson et al.

(10) Patent No.: US 12,637,767 B2
(45) Date of Patent: May 26, 2026

(54) SELECTIVE HYDRATION BY SITE SELECTIVE ATOMIC LAYER DEPOSITION

(71) Applicant: UCHICAGO ARGONNE, LLC, Chicago, IL (US)

(72) Inventors: Alex B. F. Martinson, Naperville, IL (US); Lei Cheng, Naperville, IL (US); Adam S. Hock, Chicago, IL (US); Jessica Catharine Jones, Aurora, IL (US); Ethan Phillip Kamphaus, Chicago, IL (US); Nannan Shan, Clarendon Hills, IL (US); Chunxin Luo, Chicago, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 282 days.

(21) Appl. No.: 18/088,408

(22) Filed: Dec. 23, 2022

(65) Prior Publication Data

US 2024/0209503 A1 Jun. 27, 2024

(51) Int. Cl.
*C23C 16/44* (2006.01)
*C23C 16/40* (2006.01)
*C23C 16/455* (2006.01)

(52) U.S. Cl.
CPC ...... *C23C 16/45553* (2013.01); *C23C 16/403* (2013.01); *C23C 16/4408* (2013.01)

(58) Field of Classification Search
CPC .......... C23C 16/455531; C23C 16/403; C23C 16/4408
See application file for complete search history.

(56) References Cited

U.S. PATENT DOCUMENTS

| | | | |
|---|---|---|---|
| 2012/0177903 A1* | 7/2012 | Sneck | C23C 16/45529 977/890 |
| 2016/0087028 A1* | 3/2016 | Hirota | H01L 21/02164 257/532 |
| 2017/0067151 A1* | 3/2017 | Nangou | C23C 28/042 |
| 2019/0013463 A1* | 1/2019 | Wu | H10N 50/01 |
| 2023/0104924 A1* | 4/2023 | Higgs | C23C 14/223 427/248.1 |

OTHER PUBLICATIONS

Kamphaus, et al., "Selective Hydration of Rutile TiO2 as a Strategy for Site-Selective Atomic Layer Deposition," ACS Applied Materials & Interfaces 14(18), pp. 21585-21595 (2022) (31 page accepted manuscript provided).
Albers, et al., "Hubbard-U band-structure methods," Journal of Physics: Condensed Matter 21(34):343201, 11 pages (2009).
Alferov, "Nobel Lecture: The double heterostructure concept and its applications in physics, electronics, and technology," Reviews of Modern Physics 73(3), pp. 767-782 (2001).
Aryasetiawan, et al., "Calculations of Hubbard U from first-principles," Physical Review B 74(12):125106, 9 pages (2006).
(Continued)

*Primary Examiner* — Cachet I Proctor
(74) *Attorney, Agent, or Firm* — Foley & Lardner LLP

(57) ABSTRACT
A site-selective hydration strategy that enables site-selective atomic layer deposition (ALD). ALD is utilized to target specific locations on a crystalline material for deposition.

10 Claims, 6 Drawing Sheets

(56) References Cited

OTHER PUBLICATIONS

Becke, "A new mixing of Hartree-Fock and local density-functional theories," The Journal of Chemical Physics 98(2), pp. 1372-1377 (1993).

Bent, "Organic functionalization of group IV semiconductor surfaces: principles, examples, applications, and prospects," Surface Science 500(1-3), pp. 879-903 (2002).

Bilousov, et al,. "Atomic Layer Deposition of Cubic and Orthorhombic Phase Tin Monosulfide," Chemistry of Materials 29(7), pp. 2969-2978 (2017).

Bjorheim, et al., "Defect Chemistry of Rutile TiO2 from First Principles Calculations," The Journal of Physical Chemistry C 117(11), pp. 5919-5930 (2013).

Bjorheim, et al., "Defects at the (1 1 0) surface of rutile TiO2 from ab initio calculations," International Journal of Hydrogen Energy 37(9), pp. 8110-8117 (2012).

Blochl, "Projector augmented-wave method," Physical Review B 50(24), pp. 17953-17979 (1994).

Bobb-Semple, et al., "Area-Selective Atomic Layer Deposition Assisted by Self-Assembled Monolayers: A Comparison of Cu, Co, W, and Ru," Chemistry of Materials 31(5), pp. 1635-1645 (2019).

Bredow, et al., "Electronic properties of rutile TiO2 ultrathin films: Odd-even oscillations with the number of layers," Physical Review B 70(3):035419, 6 pages (2004).

Chang, et al., "Resonant Tunneling In Semiconductor Double Barriers," Applied Physics Letters 24(12), pp. 593-595 (1974).

Chen, et al., "Achieving area-selective atomic layer deposition on patterned substrates by selective surface modification," Applied Physics Letters 86(19):191910, 3 pages (2005).

Cho & Casey, "GaAs-Alx Ga1-x As Double-Heterostructure Lasers Prepared By Molecular-Beam Epitaxy," Applied Physics Letters 25(5), pp. 288-290 (1974).

Chung, et al., "Low energy electron diffraction and electron spectroscopy studies of the clean (110) and (100) titanium dioxide (rutile) crystal surfaces," Surface Science 64(2), pp. 588-602 (1977).

Comstock & Elam, "Atomic Layer Deposition of Ga2O3 Films Using Trimethylgallium and Ozone," Chemistry of Materials 24(21), pp. 4011-4018 (2012).

Diebold, "Structure and properties of TiO2 surfaces: a brief review," Applied Physics A 76, pp. 681-687 (2003).

Diebold, "The surface science of titanium dioxide," Surface Science Reports 48(5-8), pp. 53-299 (2003).

Diebold, et al., "The Relationship Between Bulk And Surface Properties of Rutile TiO 2(110)," Surface Review and Letters 7(05n06), pp. 613-617 (2000).

Diebold, et al., "Understanding Metal Oxide Surfaces at the Atomic Scale: STM Investigations of Bulk-defect Dependent Surface Processes," MRS Online Proceedings Library 654(Symposia AA), pp. AA5.1.1-AA5.1.9 (2000).

Dingle, et al., "Quantum States Of Confined Carriers In Very Thin Alx Ga1-x As-GaAs-Alx Ga1-x As Heterostructures," Physical Review Letters 33(14), pp. 827-830 (1974).

Esaki & Chang, "New Transport Phenomenon in a Semiconductor 'Superlattice'," Physical Review Letters 33(8), pp. 495-498 (1974).

Finazzi, et al., "Nature of Ti Interstitials in Reduced Bulk Anatase and Rutile TiO2," The Journal of Physical Chemistry C 113(9), pp. 3382-3385 (2009).

Fujishima & Honda, "Electrochemical Photolysis of Water at a Semiconductor Electrode," Nature 238, pp. 37-38 (1972).

Gakis, et al., "Detailed investigation of the surface mechanisms and their interplay with transport phenomena in alumina atomic layer deposition from TMA and water," Chemical Engineering Science 195, pp. 399-412 (2019).

Ganduglia-Pirovano, et al., "Oxygen vacancies in transition metal and rare earth oxides: Current state of understanding and remaining challenges," Surface Science Reports 62(6), pp. 219-270 (2007).

Garcia-Mota, et al., "Tailoring the Activity for Oxygen Evolution Electrocatalysis on Rutile TiO2(110) by Transition-Metal Substitution," ChemCatChem 3(10), pp. 1607-1611 (2011).

George, "Atomic layer deposition: an overview," Chemical Reviews 110(1), pp. 111-131 (2010).

Giese & York, "Density-functional expansion methods: Evaluation of LDA, GGA, and meta-GGA functionals and different integral approximations," The Journal of Chemical Physics 133(24):244107, 11 pages (2010).

Gosset, et al., "Interface and material characterization of thin Al2O3 layers deposited by ALD using TMA/H2O," Journal of Non-Crystalline Solids 303(1), pp. 17-23 (2002).

Gozar, et al., "High-temperature interface superconductivity between metallic and insulating copper oxides," Nature 455, pp. 782-785 (2008).

Graciani, et al., "N Doping of Rutile TiO2 (110) Surface. A Theoretical DFT Study," The Journal of Physical Chemistry C 112(7), pp. 2624-2631 (2008).

Hameeuw, et al., "The rutile TiO2 (110) surface: Obtaining converged structural properties from first-principles calculations," The Journal of Chemical Physics 124(2):024708, 8 pages (2006).

He, et al., "Prediction of high-temperature point defect formation in TiO2 from combined ab initio and thermodynamic calculations," Acta Materialia 55(13), pp. 4323-4337 (2007).

Henderson, "A surface perspective on self-diffusion in rutile TiO2," Surface Science 419(2-3), pp. 174-187 (1999).

Henderson, "Structural Sensitivity in the Dissociation of Water on TiO2 Single-Crystal Surfaces," Langmuir 12(21), pp. 5093-5098 (1996).

Himmetoglu, et al., "Hubbard-corrected DFT energy functionals: The LDA U description of correlated systems," International Journal of Quantum Chemistry 114(1), pp. 14-49 (2014).

Hwang, et al., "Emergent phenomena at oxide interfaces," Nature Materials 11, pp. 103-113 (2012).

Iwasawa, et al., "First-Principles Calculation of Point Defects in Uranium Dioxide," Materials Transactions 47(11), pp. 2651-2657 (2006).

Jiang & Bent, "Area-Selective ALD with Soft Lithographic Methods: Using Self-Assembled Monolayers to Direct Film Deposition," The Journal of Physical Chemistry C 113(41), pp. 17613-17625 (2009).

Jin, et al., "Reduced Heterogeneity of Electron Transfer into Polycrystalline TiO2 Films: Site Specific Kinetics Revealed by Single-Particle Spectroscopy," The Journal of Physical Chemistry C 116(4), pp. 3097-3104 (2012).

Johnson, et al., "A brief review of atomic layer deposition: from fundamentals to applications," Materials Today 17(5), pp. 236-246 (2014).

Kim, et al., "Selective metal deposition at graphene line defects by atomic layer deposition," Nature Communications 5:4781, 9 pages (2014).

Kowalski, et al., "Composition, structure, and stability of the rutile TiO2 (110) surface: Oxygen depletion, hydroxylation, hydrogen migration, and water adsorption," Physical Review B 79(11):115410, 16 pages (2009).

Kresse & Furthmuller, "Efficiency of ab-initio total energy calculations for metals and semiconductors using a plane-wave basis set," Computational Materials Science 6(1), pp. 15-50 (1996).

Kresse & Hafner, "Ab initio molecular dynamics for liquid metals," Physical Review B 47(1), pp. 558-561 (1993).

Kresse, et al., "Theory of the crystal structures of selenium and tellurium: The effect of generalized-gradient corrections to the local-density approximation," Physical Review B 50(18), pp. 13181-13185 (1994).

Kulik, et al., "Density Functional Theory in Transition-Metal Chemistry: A Self-Consistent Hubbard U Approach," Physical Review Letters 97(10):103001, 4 pages (2006).

Kyuno & Ehrlich, "Step-edge barriers: truths and kinetic consequences," Surface Science 383(2-3), pp. L766-L774 (1997).

Lee & Bent, "A Selective Toolbox for Nanofabrication," Chemistry of Materials 32(8), pp. 3323-3324 (2020).

Lee, et al., "Growth of Pt Nanowires by Atomic Layer Deposition on Highly Ordered Pyrolytic Graphite," Nano Letters 13(2), pp. 457-463 (2013).

(56) References Cited

OTHER PUBLICATIONS

Li, et al., "The Influence of the Bulk Reduction State on the Surface Structure and Morphology of Rutile TiO2(110) Single Crystals," The Journal of Physical Chemistry B 104(20), pp. 4944-2950.

Lindan, et al., "Mixed Dissociative and Molecular Adsorption of Water on the Rutile (110) Surface," Physical Review Letters 80(4), pp. 762-765 (1998).

Lira, et al,. "Dissociative and molecular oxygen chemisorption channels on reduced rutile TiO2(110): An STM and TPD study," Surface Science 604(21-22), pp. 1945-1960 (2010).

Lownsbury, et al., "Direct Measurements of Half-Cycle Reaction Heats during Atomic Layer Deposition by Calorimetry," Chemistry of Materials 29(20), pp. 8566-8577 (2017).

Lu, et al., "Atomic layer deposition—Sequential self-limiting surface reactions for advanced catalyst "bottom-up" synthesis," Surface Science Reports 71(2), pp. 410-472 (2016) (117 page accepted manuscript provided).

Lusvardi, et al., "An NEXAFS investigation of the reduction and reoxidation of TiO2(001)," Surface Science 397(1-3), pp. 237-205 (1998).

Mackus, et al., "From the Bottom-Up: Toward Area-Selective Atomic Layer Deposition with High Selectivity," Chemistry of Materials 31(1), pp. 2-12 (2019).

Mameli, et al., "Area-Selective Atomic Layer Deposition of SiO2 Using Acetylacetone as a Chemoselective Inhibitor in an ABC-Type Cycle," ACS Nano 11(9), pp. 9303-9311 (2017).

Mayer, et al., "Titanium and reduced titania overlayers on titanium dioxide(110)," Journal of Electron Spectroscopy and Related Phenomena 73(1), pp. 1-11 (1995).

Miikkulainen, et al., "Crystallinity of inorganic films grown by atomic layer deposition: Overview and general trends," Journal of Applied Physics 113(2):021301, 102 pages (2013).

Morita, et al., "Stability of Excess Electrons Introduced by Ti Interstitial in Rutile TiO2(110) Surface," The Journal of Physical Chemistry C 121(3), pp. 1602-1607 (2017) (18 page accepted manuscript provided).

Moynihan, et al., "Inapplicability of exact constraints and a minimal two-parameter generalization to the DFT U based correction of self-interaction error," Physical Review B 94(22):220104(R), 6 pages (2016).

Mullins, et al., "Self-Limiting Temperature Window for Thermal Atomic Layer Etching of HfO2 and ZrO2 Based on the Atomic-Scale Mechanism," Chemistry of Materials 32(8), pp. 3414-3426 (2020).

Nowotny, et al., "Electrical Properties and Defect Chemistry of TiO2 Single Crystal. I. Electrical Conductivity," The Journal of Physical Chemistry B 110(33), pp. 16270-16282 (2006).

Oba, et al., "Point defects in ZnO: an approach from first principles," Science and Technology of Advanced Materials 12(F1):034302, 14 pages (2011).

Pabisiak & Kiejna, "Energetics of oxygen vacancies at rutile TiO2(110) surface," Solid State Communications 144(7-8), pp. 324-328 (2007).

Pang, et al., "Structure of Clean and Adsorbate-Covered Single-Crystal Rutile TiO2 Surfaces," Chemical Reviews 113(6), pp. 3887-3948 (2013).

Park, et al., "Wafer-scale single-domain-like graphene by defect-selective atomic layer deposition of hexagonal ZnO," Nanoscale 7(42), pp. 17702-17709 (2015).

Parsons, "Functional model for analysis of ALD nucleation and quantification of area-selective deposition," Journal of Vacuum Science & Technology A 37(2):020911 (2019).

Parsons, et al., "Progress and future directions for atomic layer deposition and ALD-based chemistry," MRS Bulletin 36(11), pp. 865-871 (2011).

Perdew, et al., "Atoms, molecules, solids, and surfaces: Applications of the generalized gradient approximation for exchange and correlation," Physical Review B 46(11), pp. 6671-6687 (1992).

Perdew, et al., "Generalized Gradient Approximation Made Simple," Physical Review Letters 77(18), pp. 3865-3868 (1996).

Perron, et al., "Combined investigation of water sorption on TiO2 rutile (1 1 0) single crystal face: XPS vs. periodic DFT," Surface Science 601(2), pp. 518-527 (2007).

Perron, et al., "Optimisation of accurate rutile TiO2 (110), (100), (101) and (001) surface models from periodic DFT calculations," Theoretical Chemistry Accounts 117, pp. 565-574 (2007).

Persson, et al., "Quantum Chemical Study of Photoinjection Processes in Dye-Sensitized TiO2 Nanoparticles," The Journal of Physical Chemistry B 104(44), pp. 10348-10351 (2000).

Poirier, et al., "Identification of the facet planes of phase I TiO2(001) rutile by scanning tunneling microscopy and low energy electron diffraction," Journal of Vacuum Science & Technology B: Microelectronics and Nanometer Structures Processing, Measurement, and Phenomena 10(1), pp. 6-15 (1992).

Puurunen, "A Short History of Atomic Layer Deposition: Tuomo Suntola's Atomic Layer Epitaxy," Chemical Vapor Deposition 20(Oct. 11, 2012), pp. 332-344 (2014).

Samat, et al., "Hubbard U calculations on optical properties of 3d transition metal oxide TiO2," Results in Physics 6, pp. 891-896 (2016).

Setvin, et al., "Charge Trapping At The Step Edges Of TiO2 Anatase (101)," Angewandte Chemie International Edition 53(18), pp. 4714-4716 (2014).

Sholl & Steckel, "Density Functional Theory: A Practical Introduction," John Wiley & Sons, 254 pages (2011).

Sneh & George, "Thermal Stability Of Hydroxyl Groups On A Well-Defined Silica Surface," The Journal of Physical Chemistry 99(13), pp. 4639-4647 (1995).

Song, et al., "Molecular dynamics study on surface structure and surface energy of rutile TiO2 (1 1 0)," Applied Surface Science 255(11), pp. 5702-5708 (2009).

Sperling, et al., "Atomic Layer Deposition of Al2O3 Using Trimethylaluminum and H2O: The Kinetics of the H2O Half-Cycle," The Journal of Physical Chemistry C 124(5), pp. 3410-3420 (2020).

Stausholm-Moller, et al., "A density functional theory study of atomic steps on stoichiometric rutile TiO2(110)," The Journal of Chemical Physics 139(23):234704, 7 pages (2013).

Stausholm-Moller, et al., "DFT+U study of defects in bulk rutile TiO2," The Journal of Chemical Physics 133(14):144708, 8 pages (2010).

Stukowski, "Visualization and analysis of atomistic simulation data with OVITO—the Open Visualization Tool," Modelling and Simulation in Materials Science and Engineering 18(1):015012, 7 pages (2010).

Tero, et al., "Lipid Bilayer Membrane with Atomic Step Structure: Supported Bilayer on a Step-and-Terrace TiO2(100) Surface," Langmuir 24(20), pp. 11567-11576 (2008).

Terranova & Bowler, "Effect of hydration of the TiO2 anatase (101) substrate on the atomic layer deposition of alumina films," Journal of Materials Chemistry 21(12), pp. 4197-4203 (2011).

Tolba, et al., "The DFT U: Approaches, Accuracy, and Applications," Density Functional Calculations—Recent Progresses of Theory and Application, 28 pages (2018).

Tong, et al., "The Role of Surface Chemistry in Bonding of Standard Silicon Wafers," Journal of The Electrochemical Society 144(1), pp. 384-389 (1997).

Vos, et al., "Area-Selective Deposition of Ruthenium by Combining Atomic Layer Deposition and Selective Etching," Chemistry of Materials 31(11), pp. 3878-3882 (2019).

Wang, et al., "Atomically flat reconstructed rutile TiO2(001) surfaces for oxide film growth," Applied Physics Letters 108(9):091604, 4 pages (2016).

Wang, et al., "Dissociation of liquid water on defective rutile TiO2 (110) surfaces using ab initio molecular dynamics simulations," Frontiers of Physics 13(3):138107, 7 pages (2018).

Wang, et al., "Photogeneration of Highly Amphiphilic TiO2 Surfaces," Advanced Materials 10(2), pp. 135-138 (1998).

Wendt, et al., "Oxygen vacancies on TiO2(1 1 0) and their interaction with H2O and O2: A combined high-resolution STM and DFT study," Surface Science 598(1-3), pp. 226-245 (2005).

(56) References Cited

OTHER PUBLICATIONS

Wendt, et al., "The Role of Interstitial Sites in the Ti3d Defect State in the Band Gap of Titania," Science 320(5884), pp. 1755-1759 (2008).

Widjaja & Musgrave, "Quantum chemical study of the mechanism of aluminum oxide atomic layer deposition," Applied Physics Letters 80(18), pp. 3304-3306 (2002).

Yamamoto, et al., "Preparation of Atomically Smooth TiO2 Single Crystal Surfaces and Their Photochemical Property," Japanese Journal of Applied Physics 44(4L), pp. L511-L514 (2005) (abstract only, 3 pages).

Yu & Gong, "Co Oxidation at Rutile TiO2(110): Role of Oxygen Vacancies and Titanium Interstitials," ACS Catalysis 5(4), pp. 2042-2050 (2015) (30 page accepted manuscript provided).

Yuan, et al., "Surface Chemistry of Formaldehyde on Rutile TiO2(110) Surface: Photocatalysis vs Thermal-Catalysis," The Journal of Physical Chemistry C 118(35), pp. 20420-20428 (2014) (36 page accepted manuscript provided).

Zhang & Musgrave, "Comparison of DFT Methods for Molecular Orbital Eigenvalue Calculations," The Journal of Physical Chemistry A 111(8), pp. 1554-1561 (2007).

Zhang, et al,. "Unraveling the Diffusion of Bulk Ti Interstitials in Rutile TiO2(110) by Monitoring Their Reaction with O Adatoms," The Journal of Physical Chemistry C 114(7), pp. 3059-3062 (2010).

Zhang, et al., "Characterization of Ca impurity segregation on the TiO2(110) surface," Surface Science 412-413, pp. 242-251 (1998).

Zhang, et al., "Extending the reliability and applicability of B3LYP," Chemical Communications 46(18), pp. 3057-3070 (2010).

Zhao, et al., "Single Water Molecule Adsorption and Decomposition on the Low-Index Stoichiometric Rutile TiO2 Surfaces," The Journal of Physical Chemistry C 118(8), pp. 4287-4295 (2014).

Ziesche, et al., "Density functionals from LDA to GGA," Computational Materials Science 11(2), pp. 122-127 (1998).

* cited by examiner

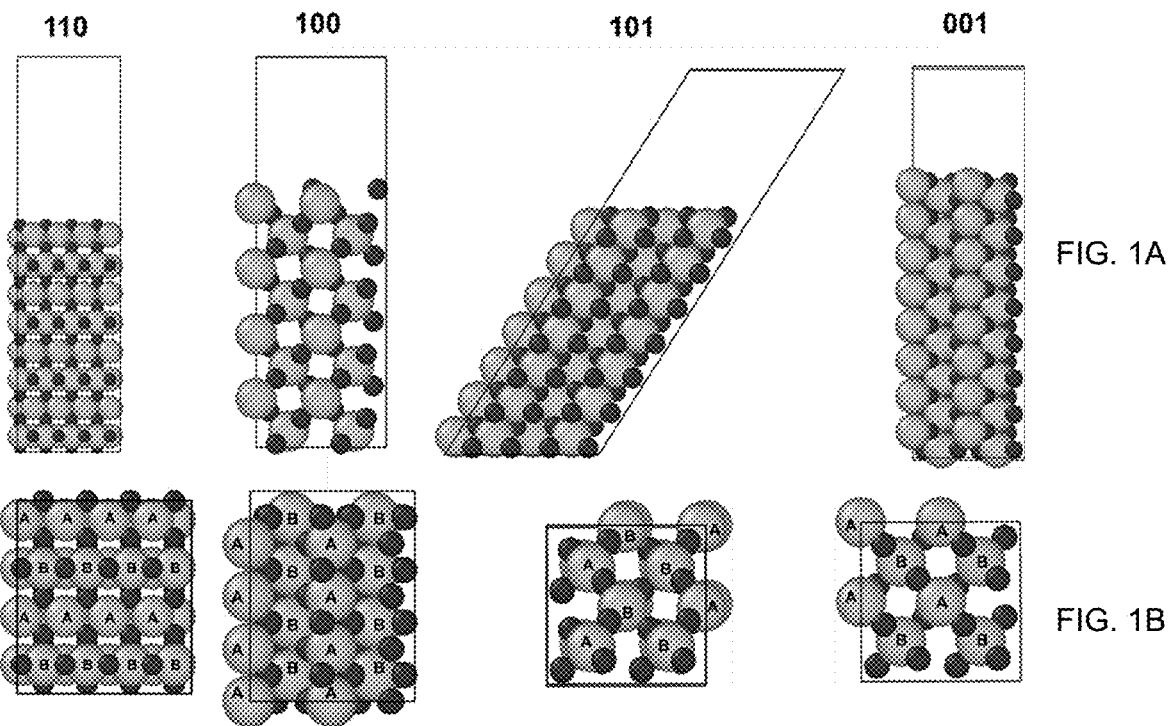
FIG. 1A
FIG. 1B
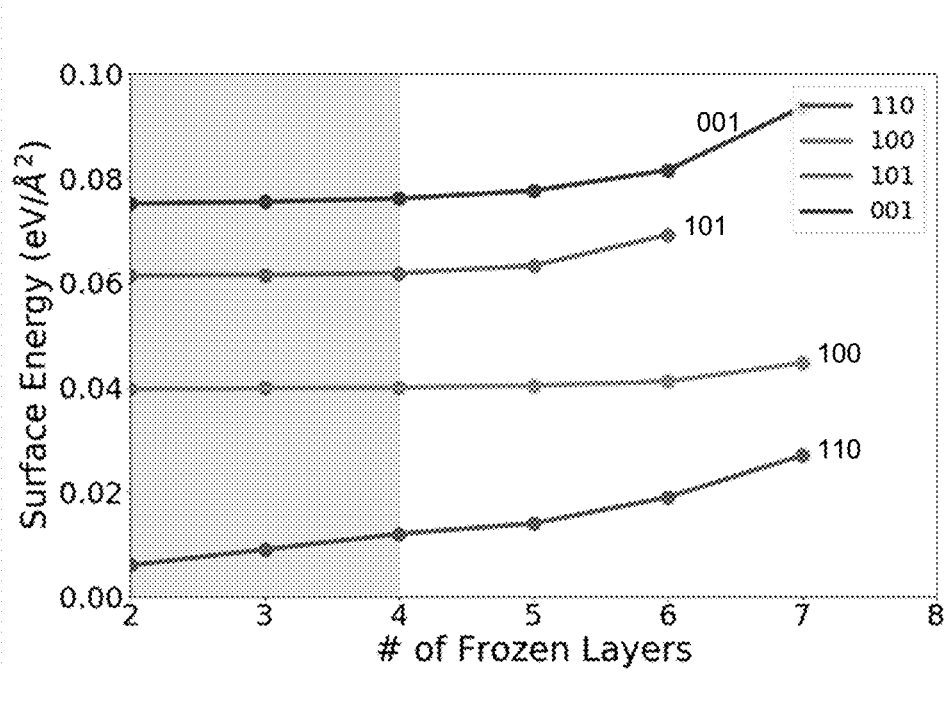
FIG. 1C

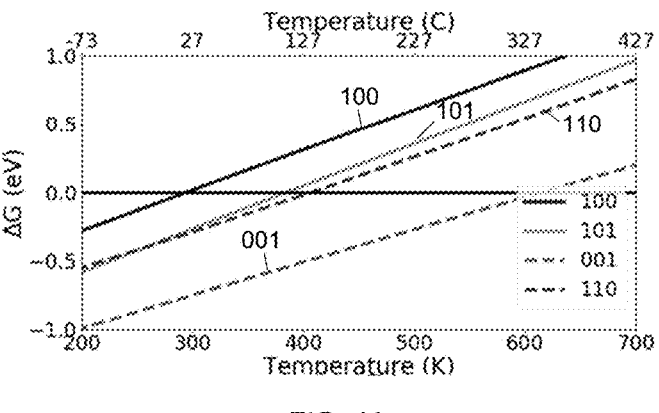
FIG. 4A
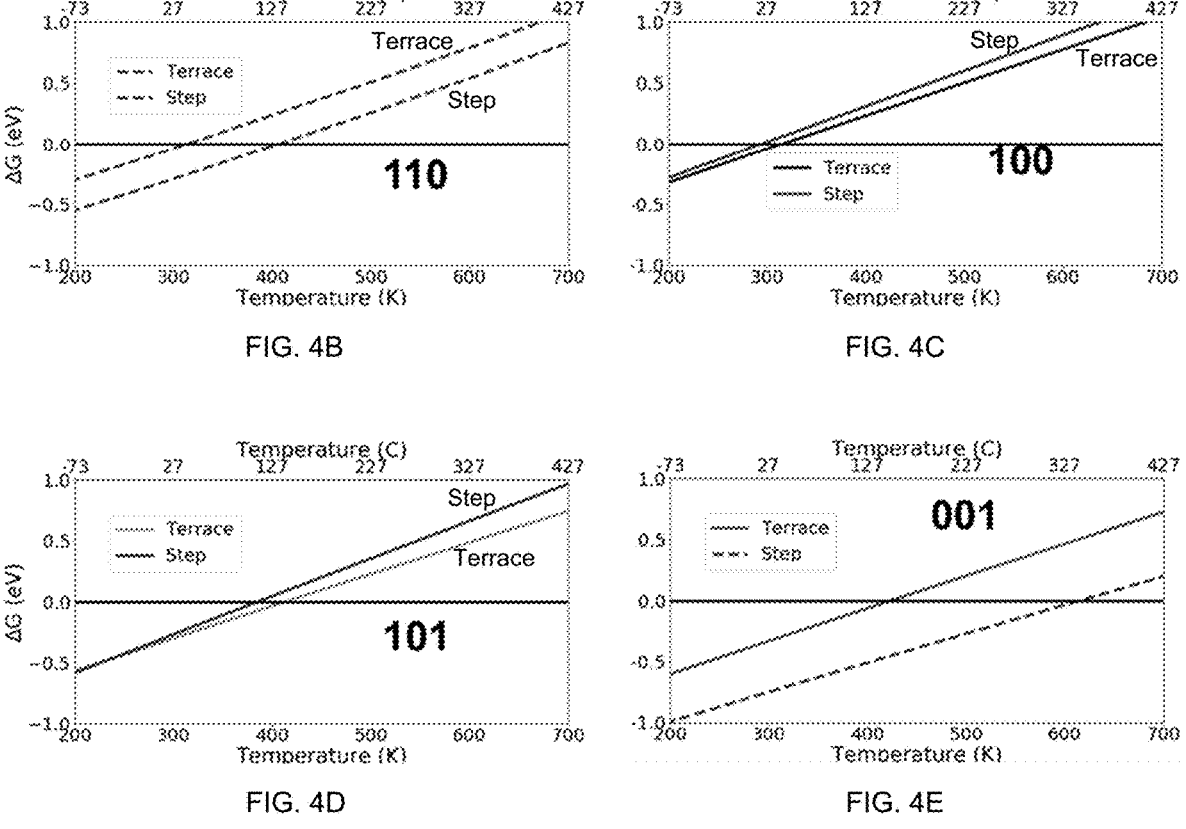
FIG. 4B                                              FIG. 4C
FIG. 4D                                              FIG. 4E

SELECTIVE HYDRATION BY SITE SELECTIVE ATOMIC LAYER DEPOSITION

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to a hydration of materials, specifically by site selective deposition, such as through atomic layer deposition ("ALD").

BACKGROUND

Molecular and atomic fabrication techniques continue to develop further applications. High temperature and high vacuum techniques including molecular beam epitaxy ("MBE") have been utilized to great success to create epitaxial heterostructures that reveal new phenomenon in condensed matter and materials physics. Due to the level of precision provided by such methods, precision structures that demonstrate emergent phenomena, including 2D superconductors, have matured from pure theory to clear experimental demonstration. Unfortunately, many exotic phenomena are acutely sensitive to electronics defects that are derived from small structural defects at interfaces. This high bar for structural perfection dramatically shortens the list of available electronic materials pairs to those that are lattice matched. However, the site-selective repair of electronic defects may circumvent the requirement for structural perfection.

While deposition techniques provide mechanisms for fabricating a wide range of structures, including at the microscopes, there remains a need for a process and system for site-selective modification by deposition. In particular, ALD provides a wide range of known precursors and applications, but is generally for processes to provide a uniform layer. Thus, a need remains for an approach to site-selective ALD in which nucleation is favored on a subset of surface atom arrangements over others on the same material requires even more discriminating surface chemistry.

SUMMARY

Embodiments described herein relate generally to a method of repairing a defect site. The method comprises providing within an atomic layer deposition reactor a substrate having an exposed defect site. A first metal oxide is deposited by an atomic layer deposition process on an defect site of the substrate. The ALD process comprise: exposing a first precursor to the ALD substrate in the ALD reactor; reacting, at a first reaction temperature, by proton exchange the first precursor with the ALD substrate at a defect site; purging the ALD reactor of the first precursor; exposing a co-reactant to the ALD substrate; and purging the co-reactant. The first precursor is selected from trimethylaluminum ("TMA"), trimethylgallium ("TMGa"), and bis(ethylcyclopentadienyl)magnesium ("Mg(Cp)$_2$").

Another embodiment relates to an oxide material comprising an oxide substrate having a step edge and a metallic material deposited at a defect site. The metal oxide is only deposited at the defect site.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are not, therefore, to be considered limiting of its scope, the disclosure will be described with additional specificity and detail through use of the accompanying drawings.

FIG. 1A is a graphical depiction of investigated rutile $TiO_2$ facets. FIG. 1B is a graphical depiction of surfaces with different Ti atom sites labeled. FIG. 1C is a surface energy convergence plot for the studied facets. The shaded region demarcates the number of frozen layers (i.e., 4) utilized in the final models.

FIG. 4A is a graph of water adsorption free energy for 110, 100, 101 and 001 facet steps. FIGS. 4B-4E are graphs of the lowest energy step vs terrace water adsorption energies for 110 (FIG. 4B), 100 (FIG. 4C), 101 (FIG. 4D), and 001 (FIG. 4E) facets, where solid and dashed lines represent molecular and dissociated configurations, respectively.

Figure 2:
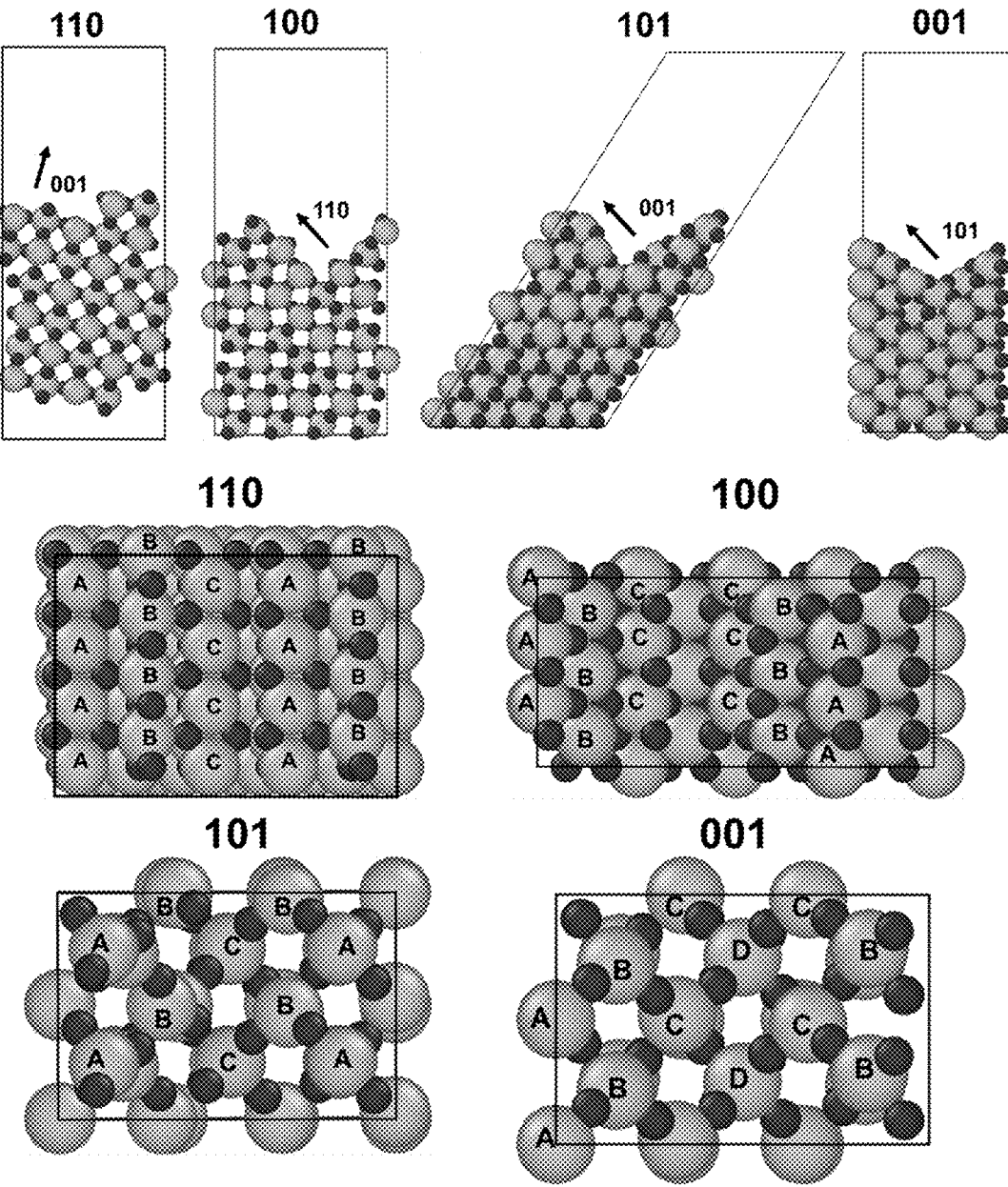
FIG. 2 is a graphical depiction of step edge models for each facet with step edge vector and identification of step edge surface sites.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Described herein are systems and methods for site-selective hydration. Selective hydration allows for deposition of material on a selected surface. In particular, an ALD approach is described for which formation of a modified surface chemistry such as by known methods, in one embodiment by hydroxyl or aqua surface functionalization is thermodynamically favored on only a subset of surface sites.

A system and process for repairing defect sites is described, allowing the list of viable electronic materials to be expanded to allow for more defect prone materials and methods to be employed in the next generation of material applications. That is to say, by adding a targeted site-selective fabrication step it may be possible to ameliorate electronic defects, such as those at some step edges that may otherwise lead to undesirable energy levels. Selective repair, in contrast to blanket passivation, requires a precision synthesis technique with exceptional specificity. Selective interface reactions with vapor phase precursors, in a process akin to atomic layer deposition ("ALD"), may be one potential approach to achieve such site-specificity.

ALD is a sequential, self-limiting synthesis process, typically proceeding via two reactions forming an overall ALD cycle in which a solid surface is reacted with a first precursor, such as a volatile metalorganic. This reaction typically proceeds until the surface reaction saturates. The precursor is then purged and followed by a second precursor complementary to the first. The reaction of the second precursor regenerates surface functionality suitable for restarting the cycle, allowing layer-by-layer deposition. ALD has been widely utilized to provide for uniform, conformal growth of layers deposited to form a dense thin film with complete coverage of a substrate.

The substrate may be selectively hydrated to create a desired functionalization. Thus, in one embodiment the methods provide for site-selective ALD of a selectively hydroxylated substrate. The site-selective ALD approach may utilize metalorganic precursors, such as a first precursor of the ALD scheme, which strictly require proton exchange for surface reaction. In such embodiments, exposure of a selectively hydroxylated substrate to a metalorganic precursor that requires protonation is believed to lead to site-selective ALD.

Substrates for use in site-selective hydration ALD generally may include any compatible substrate, but specific embodiments include oxide substrates. It should be appreciated that substrates may be materials that naturally exhibit sites with a differential propensity for hydration. The truth is that most materials oxidize in our ambient environment so this puts us back to a nearly infinite list of materials but at least conceptually it can be narrowed. Generally, suitable substrates are those which an exposed surface or edge includes sites specifically suited for hydration, either natively or with a pre-treatment to provide for an exposed moiety for reaction with the selected ALD precursor.

On the substrate, material, such as a metal oxide, is deposited. It is believed that insulating oxides are the most relevant materials to be deposited in this approach. Such embodiments enable the "removal" of mid-gap electronic density of states that result from surface defects. The deposition is on specific sites rather than, as in a typical ALD process, as a uniform coating across a substrate. In one embodiment, the ALD process utilizes a first metalorganic precursor. The selective surface hydration strategy for site-selective ALD requires that the only thermodynamically- or kinetically-viable deposition mechanisms are proton-enabled. It should be appreciated that there are known metalorganic precursors compatible with ALD process, including those with proton-enabled reaction with surface water or hydroxyl groups is well documented. However, in some embodiments, the ALD process should utilize precursors that not only have a proton-enabled reaction pathway, but also where non-proton pathways are not present or, at least, not thermodynamically favorable at reaction conditions. It will be appreciated that a substrate may present several potential exposed atoms or moieties, including with different surrounding electron influences that may impact reactivity, including at defect sites. Thus, some selectivity may be lost if the metalorganic precursor, even if having a proton-enabled pathway, can react directly with, for example, a dehydrated surface. For example, if TMA were to molecularly or dissociatively adsorb to a dehydrated terrace site (e.g., bridging oxygen) it could bypass the selectivity of hydration thermodynamics. However, if non-proton-mediated adsorption of a metalorganic ALD precursor is less favorable than hydration, then raising the process temperature above the non-proton-mediated metalorganic adsorption temperature may prevent unselective deposition without disrupting the selective hydration. As used herein, the non-proton mediated adsorption temperature is the temperature above which, more accurately range of temperatures starting at that temperatures, wherein only the non-proton mediated adsorption mediated reactions will occur to provide cyclic, self-limiting growth.

In one embodiment, ALD is utilized. In its simplest form, the ALD process consists of two half-cycles, each typically consisting of two steps (exposure of two different precursors). In a first half-cycle, in a first step, a first precursor binds to the surface of the substrate (adsorption), as described herein binding at a specific location such as a step edge, and the excess first precursor, along with the byproducts formed, are then purged in the next step. In a second half-cycle, a second precursor (or co-reactant) is added to react with the adsorbed/bound intermediate entity formed by the first precursor. The first co-reactant may be, for example, $H_2O$, $O_3$, $H_2O_2$, or other suitable co-reactants that are reactive with the ALD first intermediate. The excess second precursor and byproducts are then purged out, completing the full ALD cycle. The reaction of the second precursor with the first adsorbed entity forms a deposited material.

In one embodiment, each ALD process consists of a cycle, which may be repeated. A cycle consists of a precursor vapor pulse for an exposure followed by a purge, such as where the reactor is pumped to a vacuum, followed by a co-reactant pulse with a co-reactant exposure followed by a co-reactant purge. It should be appreciated that the dose and purge time is based on the self-limiting behavior of the precursors/co-reactants. This can be varied in a wide range from a few milliseconds to tens of seconds. In some embodiments, a single ALD cycle is sufficient to "repair" defects.

Typically, the ALD process takes place in a temperature controlled reactor. In some embodiments, the substrate can be heated to a predetermined temperature during the ALD process. In some embodiments, the first predetermined temperature is in the range of 100-350° C. Temperature also impacts the overall energy in the system and the performance for diffusion and/or reaction. In an ALD process, the deposition temperature range where more or less same growth as function of growth occurs is referred to as the "ALD window." The temperature of the layer growth can be as low as the subliming temperature of the ALD precursors.

For example, if a precursor sublimes at 150° C., films can also grow around that temperature, but generally layer growth temperature is at least 10-50° C. higher than the precursor sublimation temperature. However, as described herein, the site selective ALD process should proceed above the non-proton-mediated metalorganic absorption temperature.

Experimental Results

As further described with regarding to experimental examples, the potential of a selective hydration strategy was investigated using rutile $TiO_2$ substrates was tested as a proof of concept. $TiO_2$ was selected for its widespread use, its useful material properties and well-known presence of surface defects, however it should be appreciated that other substrates may be used. While ALD is most commonly employed in uniform conformal growth, more selective precursors and processes may allow for more precise synthetic strategies including targeted reaction at subtly unique surface sites including those that lead to electronic defects. A selective hydration strategy was employed to target reaction at the step edges of rutile $TiO_2$.

Having selected a substrate for testing, a model was utilized to simulate. A first principles computational approach allows straightforward determination of surface reaction thermodynamics. While the models used are slightly more ideal than even single crystals in experiment, the models allow for thermodynamics of adsorption to be explored with few confounding variables. In the experiments, the step-edges were targeted as the defect of interest. Step edges are a common defect that are found on rutile $TiO_2$ ("r-$TiO_2$) single crystals with even the smallest miscuts. These structural defects have been occasionally identified as electronic defects which may negatively impact future applications. However, it should be appreciate that other sites may be utilized as the target of interest. In some embodiments, a defect site (which may be, for example, any unique site) will exhibit unique thermodynamics that could allow this approach for "repair" by ALD, such as step edge, oxygen vacancy, Ti interstitial defects, grain boundaries, dislocations, high energy facets, etc.

Accurate asymmetric slab models represent the r-$TiO_2$ surface of four facets for both terrace and step edges, from which the free energy of adsorption at unique surface sites is leveraged to predict step selectivity on (110) and (001) facets. Computational evaluation of ALD precursor adsorption free energies on multiple dehydrated facets further refine the feasibility of a temperature-dependent selective hydration strategy. Initial experiments of $Ga_2O_3$ALD nucleation on $TiO_2$ single crystals broadly support the computational predictions and strategy. The strategies outlined here provide one possible route to selectively target growth at structural defects of oxide surfaces.

The experiments focused on the thermodynamics of molecular and dissociative $H_2O$ adsorption on the (110), (100), (101) and (001) facets as well as their preferred step edges to investigate the viability of site selective ALD via selective hydration. A combination of geometry optimization and frequency simulations were used to determine the free energy phase diagrams of adsorption for each site. In order to evaluate the reaction of the ALD precursors with the non-hydrated substrate, three metalorganic ALD precursors were also computationally evaluated. In particular, the results presented are for experimental observations for temperature-dependent nucleation of $Ga_2O_3$ ALD on rutile single crystals of (001) and (110) facets that is consistent with the predicted surface hydration and suggest the possibility of site-selective ALD.

Substrate Formation

The first step toward probing the feasibility of a selective hydration strategy is to ensure that an accurate model is used to represent the surface. The most common type of model used in density functional theory ("DFT")/first principles work is the slab model. Instead of creating a system with a certain thickness (in number of atomic layers), in a slab model some of the layers are frozen while others are allowed to relax. The slab model allows for a better description of a surface because it captures the bulk-like structure (in the frozen layers) as well as any deviation from that bulk behavior in atoms closer to the vacuum. However, one must parameterize the overall size of the slab and the number of frozen layers due to restraints on the simulation geometry. Parameter convergence may be determined in several possible ways depending on the system by investigating variables such as the surface energy, interlayer spacing, or other surface dependent properties. Ideally, one or more of these variables will converge and thus justify the use of a particular slab model.

As rutile $TiO_2$ was selected for the experiments; extensive characterization of features, such as the surface energetics and structures, are known. However, even for a material as well investigated as $TiO_2$, existing simulation studies have been lacking for the purpose of site specific ALD investigation.

In order to evaluate the surface energy of an asymmetric slab model, a general surface energy equation must be used. For simulating of a symmetric slab, the surface energy equation may take a simplified version as known to those skilled in the art, but a more specific variant of the equation for use as described is:

$$E_{surf}^{fix} = \frac{\left[ E_R^{SM} - E_{NR}^{SM} + \frac{E_{NR}^{SM} - nE^{bulk}}{2} \right]}{A}$$

wherein: $E_R^{SM}$ = Relaxed surface, $E_{NR}^{SM}$ = Unrelaxed surface, $E^{bulk}$ = Bulk, $A$ = Surface area of exposed facet in the equation can be evaluated from a bulk crystal simulation with a relaxed and unrelaxed surface model.

This procedure is particularly important for the 110 facet system due to a well-studied oscillatory energy convergence which arises from electron symmetry with even versus odd overall number of layers. With the use of an asymmetric slab model and the appropriate surface energy equation, this effect becomes negligible. Ideally, surface energy will converge easily as the parameters (frozen layers and size of system) are varied but this is not always the case. The surface energy of the (110) facet demonstrates this slow-to-converge behavior. In this case, the convergence of the water adsorption energy was also examined as an additional variable. For the remaining systems, the convergence of surface energy was deemed sufficient for validation of the slab models.

The final converged structures for all facets are displayed in FIGS. 1A-1B. In FIG. 1C, the shaded region demarcates the number of frozen layers (i.e., 4) utilized in the final models. While all surfaces contain both exposed oxygen and titanium, the coordination number of the titanium atoms varies. Most exposed Ti atoms (i.e., (110), (100), and (101) facets) have a coordination of 5, whereas the (001) facet presents Ti atoms with a coordination number of 4. In every facet, the surface oxygen atoms have a coordination number of 2 but in the (100) the surface oxygens are less sterically hindered than in the other facets. The converged surface energies (FIG. 1C) confirm that the (110) facet is the most stable followed by the (100), (101) and (001) facets, respectively.

Thus, these observed trends from the simulated substrates is consistent with prior studies. It should be considered that this type of simulated substrate lacks defects that may be present on a real-world substrate sample. Such defects likely alter the surface energy of the substrate. As used here for simulated substrates, the terrace models are free of such point defects, for example oxygen vacancies, which are expected to be present on an experimental sample of rutile $TiO_2$. It should be appreciated that such a model is a simplification from real-world materials, but allows a reduction in overall computations and considerations.

In addition to terraces, common step edge structures were also evaluated. Step edges are structural defect sites that can have significant consequences on material and interfacial properties. Step edges exhibit a change in the atomic structure and, therefore, the associated electronic environment. Physically, step edges are readily identified with standard scanning probe microscopies that enable experimental evaluation and validation of physical samples of substrates. However, simulated structures with step edges or prediction of step edges in real world samples has proven difficult. In particular, determining the most thermodynamically favored step for each facet can be difficult to predict with computation and simulation alone due to the large number of potential step edge structural models.

Therefore, step edge models for (110), (100) and (001) (see FIG. 2) are utilized herein were derived from previous experimental reports. In some embodiments, step edge angles can be calculated to determined favored steps on each facet, but where practical existing models would be preferred. While this approach provides sufficient modeling accuracy for the purposes herein for most step edges, because there is far less experimental evidence regarding the step edges of the (101) facet, models thereof are less robust. To accommodate for this, the (001) direction was tentatively selected as the cleavage plane due to its low index and surface energy. As for the case of terrace models, the step models are asymmetric slab models that were also subjected to a surface energy convergence procedure. Despite the irregularity of the step edge surfaces, the convergence testing was still applicable if a large enough model was used. After obtaining an accurate parameterization and geometry for the terrace and step edges of rutile $TiO_2$, selective hydration is investigated.

Hydration of Terrace Sites: Facet Selectivity

One commonly proposed mechanism for many metal oxide ALD processes is reaction of a hydroxylated surface site with the metalorganic precursor. A simple proton exchange allows for binding of the metal to surface oxygen with release of a protonated ligand. At high hydroxyl surface coverages, a near-monolayer reaction can occur, limited primarily by steric hinderance. However, at higher temperatures the growth rate of some metal oxide ALD processes is reduced due to temperature-induced dehydroxylation of the growing film front. In some experiments, the special case of site-specific dehydroxylation of the original surface/substrate was studied where dehydroxylation of terrace sites on a single crystal surface is predicted to offer few sites for nucleation. By leveraging the unique energetics of adsorption of each substrate atom arrangement, site-selective hydration may be achieved that might subsequently lead to site-selective nucleation of a metalorganic ALD precursor that is restricted to the ligand protonation mechanism.

First, the most energetically favorable configuration of water adsorption is calculated for each terrace and step following previously established procedures. The first models tested were the adsorption of molecular water over the surface titanium atoms. The thermodynamics of adsorption were first evaluated by calculating the 0° K adsorption energy for the different facets using equation:

$$E_{ads}(0\ K) = E_{TiO2-H2O} - E_{H2O} - E_{TiO2},$$

where $E_{TiO2-H2O}$, $E_{H2O}$, and $E_{TiO2}$ are the energies of water adsorbed on the surface, the original surface, and the water molecule in gas phase, respectively. All energy terms in the equation are evaluated from geometry optimizations using DFT that does not take into account entropic contributions and is thus equivalent to 0° K. The results of the 0° K adsorption energies are displayed in Table 1. Given the low extent of hydration, a low surface coverage was assumed and adsorption results with higher surface coverage were not utilized. From the energetics of $H_2O$ adsorption of the terrace sites, it can be seen that the (101) facet has the lowest overall molecular adsorption energy and, therefore, its hydration is the most thermodynamically favorable. As shown in Table 1, water dissociation on the (100) facet of rutile $TiO_2$ is not favored over molecular absorption. On (101) and (110) surface dissociation and molecular absorption energetics are nearly equal, while for 001 dissociation is favored. The (110) facet results here are within the relatively wide range of previously reported computational studies though exact comparisons are difficult due to different methodologies, programs and levels of theory. As a confirmation on the calculated energies for these experiments, they were compared to published results and even for the less published higher surface energy facets, the adsorption energies calculated qualitatively match.

TABLE 1

| Water adsorption energies for different rutile facets at 0° K. | | |
|---|---|---|
| Facets | Molecular Adsorption Energy (eV) | Dissociated Adsorption Energy (eV) |
| $TiO_2$ (110) | −0.76 | −0.78 |
| $TiO_2$ (100) | −0.96 | −0.79 |
| $TiO_2$ (101) | −1.18 | −1.16 |
| $TiO_2$ (001) | −1.11 | −1.22 |

While the 0° K adsorption energies of hydration provide a useful comparison, the most experimentally relevant insight will be gleaned from estimating entropic effects which allows us to evaluate the free energy of the system at variable temperature. This calculation requires additional simulation to determine the vibrational frequencies of the model in question and then uses harmonic approximations to evaluate the free energy from these vibrational modes.

$$G_{adsorption}(P, T) = G_{TiO2-H2O}(P, T) - G_{TiO2}(P, T) - G_{H2O}(P, T)$$

Figure 3A:
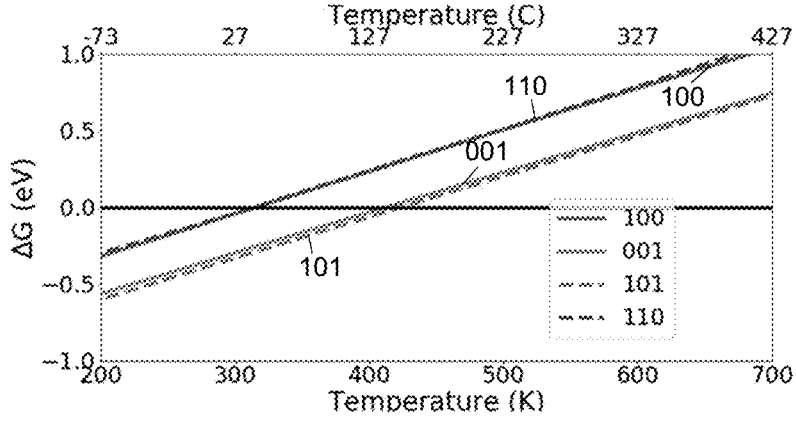
FIG. 3A is a graph of water adsorption free energy for the most favorable adsorption configuration on 110, 100, 101 and 001 facets, where solid and dashed lines represent molecular and dissociated configurations respectively.
Figure 3B:
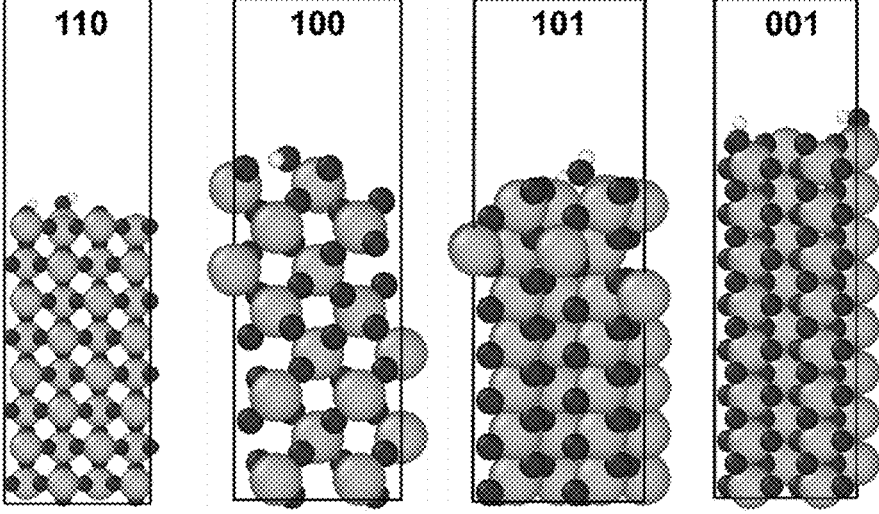
FIG. 3B is a graphical representation of the optimized systems.

Free energies can be calculated over an arbitrary temperature range, however any solid material will eventually change phase or decompose at sufficiently high temperature. Rutile is the highest temperature $TiO_2$ phase and does not melt until over 2000° K. By comparing the desorption temperatures (where the lines intersect 0° K), it can be quickly determined if selective hydration might be possible. From FIGS. 3A-3B, water adsorption on the (100) and (110) facets is no longer favorable at ~300° K while the (101) and (001) facets a predicted to dehydrate after ~400° K. Previously reported temperature programmed desorption studies of the (110) facet under UHV conditions corroborates nearly complete $H_2O$ desorption from pristine samples at ~300° K. According to these predictions, some facet selectivity for hydroxylation/hydration is expected among rutile terrace sites. For example, if one wanted to hydrate only the (101) and (001) low index facets of a polycrystalline rutile sample, then the temperature could be raised above 300° K but less than 400° K. This should encourage any water adsorbed to the (100) and (110) facets to desorb while the (101) and (001) facets would remain at least partially hydrated. In the limit of a perfectly terraced single crystal without step or other surface defect, a strictly proton-mediated ALD process should rapidly nucleate on a hydrated (101) sample at 373° K, while a (110) crystal will not present the correct surface chemistry to initiate the ALD surface reaction.

Hydration of Step Edges: Step Selectivity

After predicting and demonstrating facet selectivity through a selective hydration strategy, experimental consideration was given to defects. In particular, step edge structural defects that may introduce electronic defects were considered. As for the simulation of the step edges, the same procedures used to investigate terrace sites is repeated. However, due to the increased size of the step edge surfaces, more sites must be tested to determine which structures are the most energetically favorable. Step edge sites often have the same structure as the corresponding terrace site with the same normal vector. The most important differences between the step edges and terraces are the sites precisely where two facets intersect and create a unique coordination environment. In the experimental model using titanium dioxide, the titanium atom that is the closest to the intersection of two facets is labeled as C, as shown in FIG. 2, whereas the site that is the furthest from the intersection is labeled A. Site B represents a middle ground between the unique coordination environment of site C and of the near terrace site A. Since the step edges can be thought of as microfacets, site B should be the most similar site to a terrace site of the microfacet. Essentially, the site B microterrace may behave like a corresponding terrace site. As with the terrace sites, both the molecular and dissociated configurations of $H_2O$ were tested to determine the most accurate thermodynamics. As the zero free energy crossing of the micro-terrace can differ by more than 200° K from corresponding terrace sites, the importance of simulating sites near the step edge kink is clear.

A wide range of water adsorption energies are deduced for the four different step models, FIG. 4A. The strongest water adsorption is predicted at the (001) step which does not become energetically unfavorable until 600° K. The (101) and (110) step edges share a similar exergonic water desorption and the 100 step edge exhibits the weakest $H_2O$ adsorption. It is notable that the most favorable hydration site is not always at site C (the Ti atom closest to the kink). For the (110), (101) and (100) steps, site C does exhibit the lowest energy of hydration, however for the case of the (001) step site A (furthest from the kink) is the most favorable.

Comparing the step edges to each other provides useful insight, however comparing the thermodynamics of water adsorption between the terrace sites and the step edges of a single facet most clearly reveal the potential for site-selectivity (FIGS. 4B-4E).

Step selectivity for ALD might be achieved if the desorption temperature of water on the step edge is higher than that of the terrace. The (110) and (001) facets exhibit temperature difference for step—over terrace—hydration of at least 100° K. For example, for the (110) simulations, raising the temperature above 300° K is expected to favor water desorption from terrace sites while step hydration remains favorable. For the (001) facet, the favorability of the step edge is even larger, creating a wide temperature window of ~200° K for selective hydration. In contrast, the most common (100) and (101) step edges have hydration thermodynamics very similar to their respective terrace sites. For both facets, the zero free energy temperature difference is less than 25° K and the terrace dehydration temperature is, in contrast, slightly higher. Therefore, selective hydration of step edge sites is not a viable strategy for selective ALD nucleation on (100) and (101) rutile $TiO_2$ facets.

Precursor Selectivity

As noted above, the site-specific ALD process utilizes an ALD precursor that is Three different ALD precursors were computationally investigated: TMA, TMGa and bis(ethylcyclopentadienyl)magnesium ("$Mg(Cp)_2$"). These ALD precursors were chosen for their popularity as well as their diverse reactivity. Adsorption energies were calculated only for dehydrated terrace sites as metalorganic adsorption at dehydrated step edge sites will not disrupt hydration selectivity. In fact, if the ALD precursors adsorb on dehydrated step edge sites, that would only enhance the step selectivity.

Figures 5A, 5B:
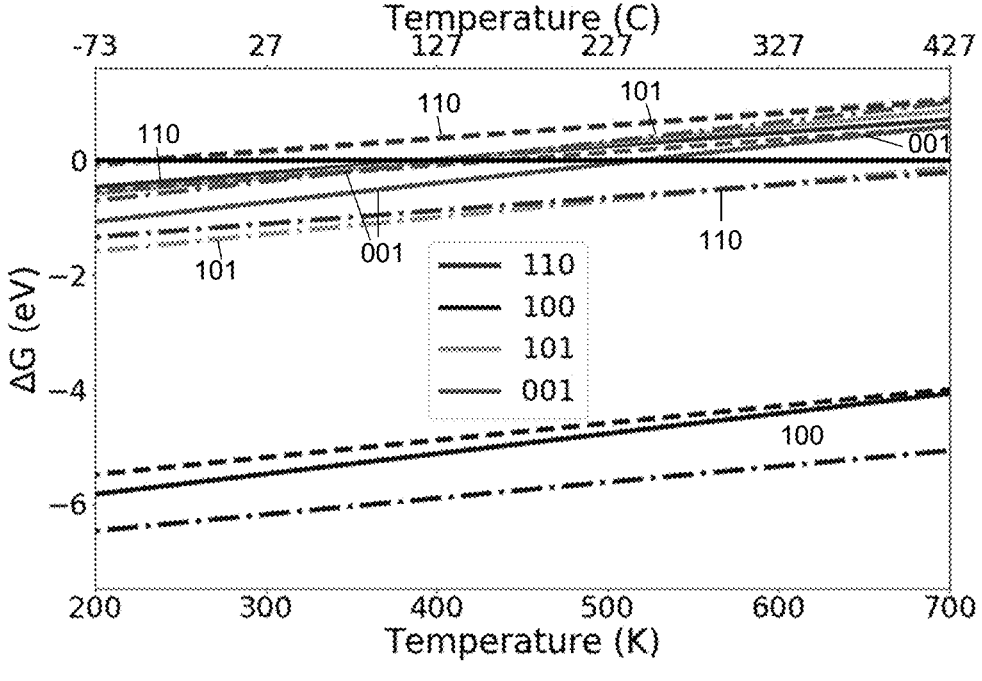
FIG. 5A is a graph of precursor adsorption free energy for (110), (100), (101), and (001) terrace sites, where solid, dashed and dash-dot line indicate trimethylaluminum ("TMA"), trimethylgallium ("TMGa"), and $Mg(Cp)_2$ respectively.
FIG. 5B is a graphical depiction of TMA, TMGa, and $Mg(Cp)_2$ adsorption on the 100 facet.

From the predicted desorption temperatures of the precursors (FIGS. 5A-5B), it is clear that precursor adsorption (regardless of reaction or dissociation) to dehydrated terraces could be a significant challenge to the site-selective ALD strategy via selective hydration. For example, on the (100) and (001) facets TMA is predicted to desorb in a range of temperatures much higher than $H_2O$ will desorb. TMGa and $Mg(Cp)_2$ were investigated as potentially less reactive (more selective) metalorganic precursors. TMGa has the weakest adsorption to all dehydrated facets, thereby making it the most promising of the three for the site-selective hydration ALD strategy. Interestingly, $Mg(Cp)_2$ has the strongest adsorption for most of the facets, which may arise from the size of the precursor molecule. In all simulations one precursor molecule was used as a probe, however since $Mg(Cp)_2$ is a larger molecule, it exhibits the largest potential for interactions with itself through the periodic boundary conditions. Precursor adsorption to a dehydrated terrace site is also predicted to be much stronger for the (100) facet by ~4-5 eV despite no discernible reactions. Further examination reveals that the main difference between the (100) and other facets is the presence of less sterically hindered oxygens on the (100) surface. These oxygen atoms interact with the precursor in a more favorable configuration which results in a far more negative adsorption energy. In this case, it is important to note that at some temperature, the precursor will decompose instead of desorbing which would create a variety of products that are likely not desirable for selective and controlled growth.

An evaluation of the selective hydration strategy for step edges is best performed by comparing free energies for each elementary adsorption step considered herein for each facet independently, FIGS. 6A-6D. Each plot contains the free energy of adsorption for $H_2O$ on the terrace site, step edge, and the free energy of adsorption for the three different tested precursors. When considering the adsorption of the ALD precursors TMGa is the preferred candidate of the three due to its low desorption temperature. For the rutile (100) facet, the strong adsorption energies of the precursors to dehydrated terrace sites may reduce selectivity for the step edge. That is, it is believed that the (100) facet may require higher temperature and longer purge times in order to prevent $H_2O$ reaction with adsorbed TMA/TMGa/Mg $(Cp)_2$ in a reaction that would otherwise spoil site-selectivity. For example, one would need to work at temperatures that are unfavorable for metal precursor absorption, where the more unfavorable the thermodynamics, the better the kinetics are typically. For the (101) facet, the step and terrace sites are about equally favored thermodynamically so that step selectivity is not significant, however it is believed that TMGa to again be the best precursor with which to investigate The (110) and (001) facets demonstrate high potential for step selectivity due to significantly higher temperature for step vs terrace dehydration combined with low precursors desorption temperatures.

Experimental Evaluation

Figures 6A, 6B, 6C, 6D:
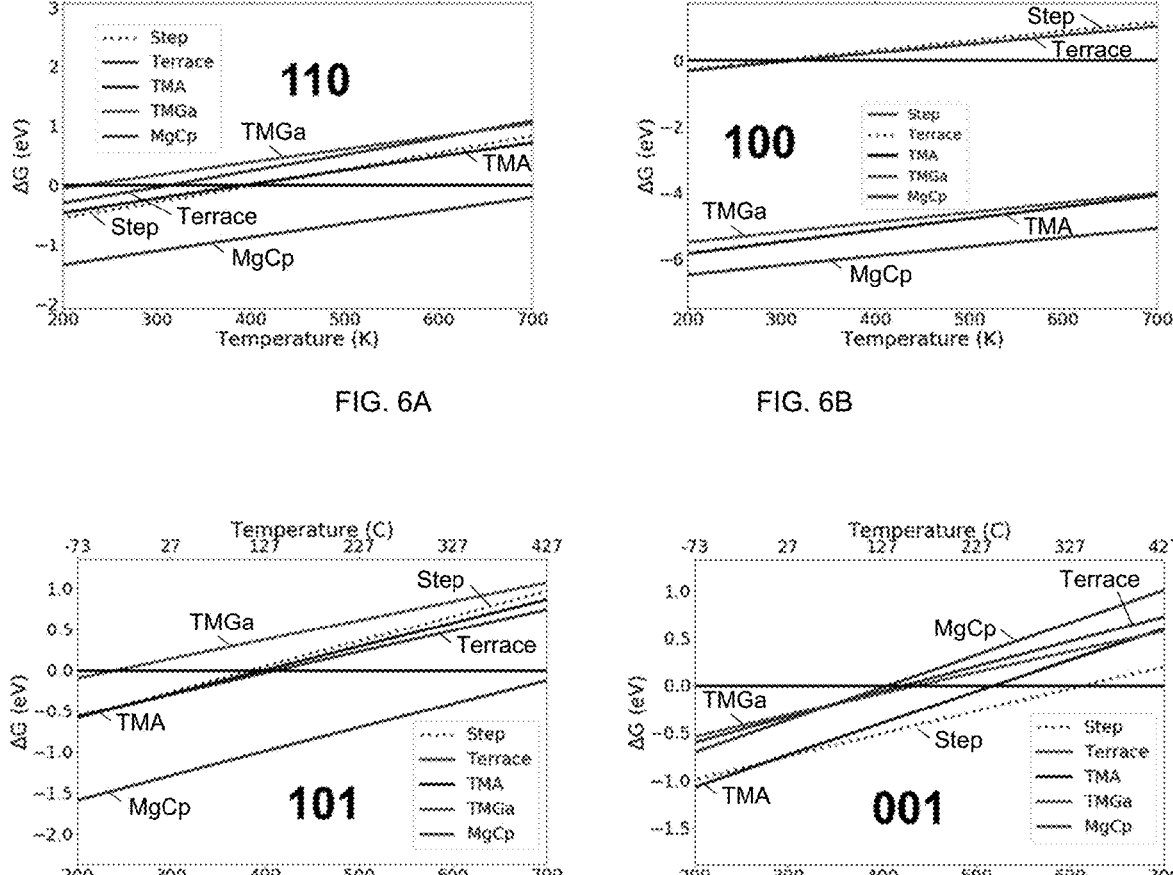
FIGS. 6A-6D are graphs of free energy of adsorptions for selectivity for 110 (FIG. 6A), 100 (FIG. 6B), 101 (FIG. 6C), and 001 (FIG. 6D) facets. For water absorption on step, terrace and for TMA, TMGa and MgCp adsorptions on terrace sites respectively.

An initial experimental exploration of the selective hydration strategy was performed using $TMGa/O_3$ ALD at 523° K (250° C.) on the (110), (001), (100) facets of rutile $TiO_2$. The $TMGa/O_3$ ALD process has been previously reported to grow at ~0.5 Å/cycle in steady state (i.e., on itself). Initiation and steady state growth of the $TMGa/O_3$ ALD process is proposed to proceed through a ligand-exchange mechanism that is often observed for metal alkyls on hydroxylated surfaces. Therefore, it may be expected that virtually no growth be observed on the (110) facet of rutile $TiO_2$ due to the predicted absence of terrace and step hydroxyls (FIG. 6A). In contrast, the step edges of the (001) facet are predicted to be hydroxylated which might lead to slow but finite nucleation. Ex situ ellipsometric analysis of these single crystal substrates before and after 30 cycles of TMGa/ $O_3$, Table 2, reveals almost no growth on $TiO_2$ (110) (<1 Å) and strongly inhibited nucleation on $TiO_2$ (001) (~2 Å), in line with computational predictions. In stark contrast, more than 10 Å of $Ga_2O_3$ was deposited on a witness $Si/SiO_2$ control sample that is expected to be hydroxyl-terminated under these same process conditions. An ALD $Ga_2O_3$-terminated Si witness samples was also included in the reactor at the same time and subjected to the same conditions, resulting in 12 Å of additional $Ga_2O_3$ deposition at a growth rate of 0.4 Å/cycle, similar to that previously reported (0.5 Å/cycle). Finally, a $TiO_2$ (100) single substrate that is understood to be dehydroxylated at the selected growth temperature of 523° K but may exhibit strong TMGa absorption (see FIG. 6B), resulted in ~3 Å of total growth in 30 cycles.

TABLE 2

$Ga_2O_3$ deposition thickness after 30 cycles of a
TMGa/$O_3$ ALD process at 250° C. on various substrates.

| Sample | Thickness (Å) |
|---|---|
| $TiO_2$ (110) | 0.85 ± 0.11 |
| $TiO_2$ (001) | 2.13 ± 0.22 |
| $TiO_2$ (100) | 2.91 ± 0.13 |
| $SiO_2$/Si | 10.41 ± 0.04 |
| $Ga_2O_3$/$SiO_2$/Si | 11.83 ± 0.13 |

$Ga_2O_3$ ALD nucleation and subsequent growth on $TiO_2$ single crystals surfaces is qualitatively consistent with FIG. 4A, which predicts that all three facets tested will present dehydroxylated terraces, on which $Ga_2O_3$ ALD nucleation is strongly inhibited. The greatest inhibition is observed on the (110) substrate, which is predicted to be dehydroxylated at both terrace and step sites. While 0.85 Å of deposition of the (110) single crystal in 30 ALD cycles (average growth rate of 0.028 Å/cycle) represents much less than one monolayer of growth, the finite growth rate might be attributed to Ca surface impurities, other intrinsic surface impurities (e.g., oxygen vacancies), or potentially precursor adsorption at step edges. $TiO_2$ (001) and (100) substrates also exhibit inhibition but slightly less so, consistent with predicted absorption of water at step-sites and precursor at terraces, respectively. These results, in aggregate, suggest that computational prediction of temperature-dependent selective hydration and precursor absorption may aid in the identification of site-selective ALD strategies.

Simulated Substrate Methodology

First principles simulations of the rutile $TiO_2$ surface were carried out with DFT code VASP with the slab approximation. The Perdew-Burke-Ernzerhof generalize gradient approximation ("PBE-GGA") exchange-correlation functional was used to describe the dynamic electron correlation with the use of a projector augmented wave ("PAW") pseudopotentials for electron-nuclei interactions. Periodic boundary conditions ("PBC") were utilized to best represent the structure of a surface. For all simulations an electronic convergence energy of ($1 \times 10^{-6}$ eV) was applied with a gaussian smearing scheme (smearing parameter of 0.5). The cutoff energy and K-point grid for Brillouin zone integration were determined for each system by first determining the lowest cutoff energy that can be used without changing the bulk with a 9×9×9 K-point grid and then using that cutoff to find the K-point mesh that is energetically appropriate A cutoff energy of 400 eV and K-point grid of 3×3×3 were used for all systems studied in this work.

All systems were created by first optimizing bulk rutile $TiO_2$ structure followed by cleavage along the (110), (100), (101), and (001) planes. These four planes were selected since they have been previously identified as the lowest surface energy planes and are available in single crystal form. After cleavage, the asymmetric slab models were constructed by converging the number of frozen layers and the overall size of the model, with details presented in the "Results and Discussion" section. Due to the complexity and large state space for possible step edges even on one facets, the simulation of step models must be simplified in order to test the concept of selective hydration. Step models were created in the same fashion as the terrace sites with the (110), (100), and (001) step edges derived from previous literature. In the case of the (101)-step edge, there is little experimental evidence, so a step-structure was computationally constructed based on a low index normal direction. For all adsorbate models, multiple structures were tested to ensure a sufficient sampling of configurational space. All simulations executed for this work were geometry optimizations followed by a numerical frequency calculation to provide the relevant frequencies. The harmonic approximation for the vibrational modes was applied with standard statistical thermodynamic expressions to achieve the free energy. The pressure in the system is 1 mTorr for all free energy plots. All snapshots of structures in this work were obtained with OVITO. Every structure used in this report can be found in the SI in the orthographic projection subsection.

Physical Substrate Methodology

Polished $TiO_2$ single crystals of various orientations were obtained from MTI Corp. $TiO_2$ single crystals with (001), (100), and (110) orientations were loaded into a commercial ALD system (Cambridge Nanotech, Inc., Savannah 200). First, the reactor and substrates were exposed to 3 minutes of $O_3$ pulses (3-60 s pulses separated by 30 s) to "preclean" the surfaces by removing potential organic contaminants. Alternating pulses of trimethylgallium ("TMGa") and ozone were used for ALD of $Ga_2O_3$ at 250° C. TMGa was obtained from Strem and used without further purification and $O_3$ was obtained from a corona arc discharge generator (DelOzone) which produces ~5 wt % $O_3$ in $O_2$ from high-purity $O_2$ delivered at 0.4 l/min during dosing. A dosing schedule of 0.015 second TMGa, 20 second purge, 60 second $O_3/O_2$, followed by 30 second purge was repeated for each cycle. The dosing schedule was previously optimized to provide a saturating surface reaction that maximized the gallium oxide growth rate/cycle when grown on itself.

The thickness of the gallium oxide layer was characterized ex situ via ellipsometry (J A Woollam Co, AlphaSE multiangle ellipsometer). The bare $TiO_2$ single crystals were characterized by ellipsometry immediately prior to introduction into the reaction chamber and immediately after ALD dosing with the same crystal orientation.

Definitions

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of repairing a defect site comprising:
   providing within an atomic layer deposition (ALD) reactor an ALD substrate having an exposed defect site; and
   depositing a first metal oxide by an ALD process on a defect site of the substrate by:
   exposing a first precursor to the ALD substrate in the ALD reactor;
   reacting, at a first reaction temperature, by proton exchange the first precursor with the ALD substrate at a the exposed defect site;
   purging the ALD reactor of the first precursor;
   exposing a co-reactant to the ALD substrate; and
   purging the co-reactant;
   wherein the first reaction temperature is above a nonproton mediated metalorganic adsorption temperature for the first precursor; and
   further wherein depositing the first metal oxide does not form a layer on the ALD substrate.

2. The method of claim 1, wherein the substrate is hydroxalyted.

3. The method of claim 1, where the substrate is an oxide.

4. The method of claim 1, wherein the defect site comprises an electronic defect.

5. The method of claim 4, wherein the electronic defect is selected from defects consisting of step edges, oxygen vacancy, grain boundaries, dislocations, and high energy facets.

6. The method of claim 1, wherein the first precursor reacts with the ALD substrate only through proton exchange mediated reactions.

7. A method of repairing a defect site comprising:
   providing within an atomic layer deposition (ALD) reactor an ALD substrate having an exposed defect site; and
   depositing a first metal oxide by an ALD process on a defect site of the substrate by:
   exposing a first precursor to the ALD substrate in the ALD reactor;
   reacting, at a first reaction temperature, by proton exchange the first precursor with the ALD substrate at a defect site,
   purging the ALD reactor of the first precursor;
   exposing a co-reactant to the ALD substrate; and
   purging the co-reactant;

wherein the first precursor is selected from trimethyl-aluminum (TMA), trimethylgallium (TMGa) and bis(ethylcyclopentadienyl)magnesium $(Mg(Cp)_2)$;

wherein the first reaction temperature is above a non-proton mediated metalorganic adsorption temperature for the first precursor; and further wherein depositing the first metal oxide does not form a layer on the ALD substrate.

8. The method of claim 7, wherein the defect site comprises an electronic defect.

9. The method of claim 8, wherein the electronic defect is selected from defects consisting of step edges, oxygen vacancy, grain boundaries, dislocations, and high energy facets.

10. The method of claim 7, wherein the first precursor reacts with the ALD substrate only through proton exchange mediated reactions.

* * * * *